(12) United States Patent
Wang et al.

(10) Patent No.: US 8,551,876 B2
(45) Date of Patent: Oct. 8, 2013

(54) MANUFACTURING METHOD FOR SEMICONDUCTOR DEVICE HAVING METAL GATE

(75) Inventors: Yu-Ren Wang, Tainan (TW); Te-Lin Sun, Kaohsiung (TW); Szu-Hao Lai, Kaohsiung (TW); Po-Chun Chen, Tainan (TW); Chih-Hsun Lin, Ping-Tung County (TW); Che-Nan Tsai, Tainan (TW); Chun-Ling Lin, Tainan (TW); Chiu-Hsien Yeh, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/212,187

(22) Filed: Aug. 18, 2011

(65) Prior Publication Data

US 2013/0045594 A1 Feb. 21, 2013

(51) Int. Cl.
 *H01L 21/28* (2006.01)
(52) U.S. Cl.
 USPC ............ 438/589; 438/573; 438/576
(58) Field of Classification Search
 CPC ...................................................... H01L 21/28
 See application file for complete search history.

(56) References Cited

U.S. PATENT DOCUMENTS

| | | | |
|---|---|---|---|
| 6,066,533 A | 5/2000 | Yu | |
| 6,492,217 B1 | 12/2002 | Bai | |
| 6,552,377 B1 | 4/2003 | Yu | |
| 6,696,345 B2 | 2/2004 | Chau | |
| 6,790,719 B1 | 9/2004 | Adetutu | |
| 6,794,234 B2 | 9/2004 | Polishchuk | |
| 6,902,969 B2 | 6/2005 | Adetutu | |
| 6,921,711 B2 | 7/2005 | Cabral, Jr. | |
| 7,030,430 B2 | 4/2006 | Doczy | |
| 7,074,664 B1 | 7/2006 | White | |
| 7,109,079 B2 | 9/2006 | Schaeffer, III | |
| 7,126,199 B2 | 10/2006 | Doczy | |
| 7,157,378 B2 | 1/2007 | Brask | |
| 7,193,893 B2 | 3/2007 | Forbes | |
| 7,208,366 B2 | 4/2007 | Tsai | |
| 7,381,619 B2 | 6/2008 | Wang | |
| 7,390,709 B2 | 6/2008 | Doczy | |
| 7,488,656 B2 | 2/2009 | Cartier | |
| 7,785,958 B2 | 8/2010 | Doczy | |
| 2002/0127888 A1 | 9/2002 | Cho et al. | |
| 2005/0095763 A1 | 5/2005 | Samavedam | |
| 2005/0202659 A1 | 9/2005 | Li et al. | |
| 2005/0275035 A1 | 12/2005 | Mathew | |
| 2006/0040482 A1 | 2/2006 | Yang et al. | |
| 2006/0054943 A1 | 3/2006 | Li et al. | |
| 2007/0037335 A1 | 2/2007 | Chambers et al. | |
| 2007/0082445 A1 | 4/2007 | Yang et al. | |
| 2007/0138559 A1 | 6/2007 | Bohr | |
| 2007/0148838 A1 | 6/2007 | Doris et al. | |
| 2007/0210354 A1 | 9/2007 | Nabatame et al. | |
| 2008/0076216 A1 | 3/2008 | Pae et al. | |
| 2008/0318371 A1 | 12/2008 | Lin et al. | |
| 2009/0057787 A1 | 3/2009 | Matsuki et al. | |
| 2009/0166769 A1 | 7/2009 | Metz et al. | |

(Continued)

*Primary Examiner* — Walter H Swanson
(74) *Attorney, Agent, or Firm* — Winston Hsu; Scott Margo (57) ABSTRACT

A manufacturing method for a semiconductor device having a metal gate includes providing a substrate having at least a first semiconductor device formed thereon, forming a first gate trench in the first semiconductor device, forming a first work function metal layer in the first gate trench, and performing a decoupled plasma oxidation to the first work function metal layer.

15 Claims, 5 Drawing Sheets

(56) References Cited

U.S. PATENT DOCUMENTS

| | | |
|---|---|---|
| 2010/0052074 A1 | 3/2010 | Lin et al. |
| 2010/0068877 A1 | 3/2010 | Yeh et al. |
| 2010/0081262 A1 | 4/2010 | Lim et al. |
| 2010/0127335 A1* | 5/2010 | Niimi et al. .................. 257/368 |
| 2011/0127589 A1* | 6/2011 | Chen et al. .................. 257/288 |

* cited by examiner

MANUFACTURING METHOD FOR SEMICONDUCTOR DEVICE HAVING METAL GATE

BACKGROUND OF THE INVENTION

1. Field of the Invention

The invention relates to a manufacturing method for a semiconductor device having metal gate, and more particularly, to a manufacturing method for a semiconductor device having metal gate integrated with the gate last process.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high dielectric constant (hereinafter abbreviated as high-k) materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is always a continuing need in the semiconductor processing art to develop semiconductor device renders superior performance and reliability such as ensure the metal gate of the n-type metal-oxide-semiconductor (nMOS) having a work function of about 4.1 eV and the metal gate of the p-type MOS (pMOS) having a work function of about 5.1 eV even though the conventional silicon dioxide or silicon oxynitride gate dielectric layer is replaced by the high-K gate dielectric layer and the conventional polysilicon gate is replaced by the metal gate.

SUMMARY OF THE INVENTION

According to an aspect of the present invention, a manufacturing method for a semiconductor device having metal gate is provided. The manufacturing method includes providing a substrate having at least a first semiconductor device formed thereon, forming a first gate trench in the first semiconductor device, forming a first work function metal layer in the first gate trench, and performing a decoupled plasma oxidation (hereinafter abbreviated as DPO) to the first work function metal layer.

According to the manufacturing method for a semiconductor device provided by the present invention, the DPO is performed to the first work function metal layer for tuning a work function of the first work function metal layer. Since the first work function metal layer treated by the DPO has obtained a target work function, a conventional post thermal anneal treatment is replaced, and thus the adverse impact from the post-metal anneal treatment is avoided. In other words, the manufacturing method for a semiconductor device provided by the present invention not only ensures the p-type or n-type semiconductor device obtains a metal gate having the work function fulfilling its requirement but also ensures the performance of the p-type or n-type semiconductor device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a manufacturing method for metal gates provided by a first preferred embodiment of the present invention, wherein FIG. 5 is a schematic drawing in a step subsequent to FIG. 4, FIGS. 6-10 are schematic drawings illustrating a manufacturing method for metal gates provided by a second preferred embodiment of the present invention, wherein

DETAILED DESCRIPTION

Figure 1:
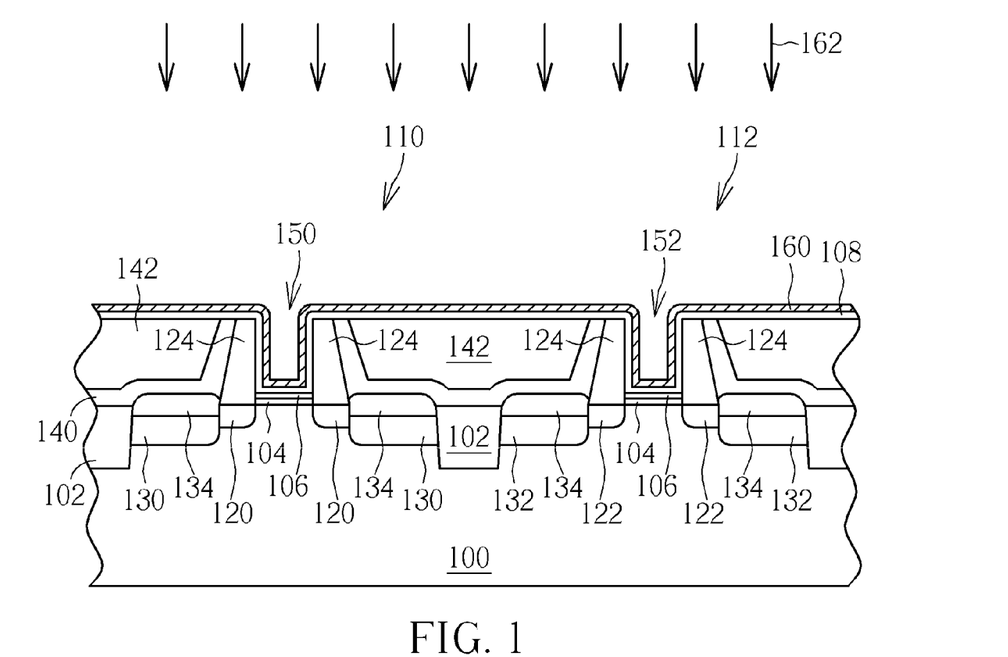

Please refer to FIGS. 1-5, which are drawings illustrating a manufacturing method for a semiconductor device having metal gate provided by a first preferred embodiment of the present invention. As shown in FIG. 1, the preferred embodiment first provides a substrate 100 such as silicon substrate, silicon-containing substrate, or silicon-on-insulator (SOI) substrate. The substrate 100 includes a first semiconductor device 110 and a second semiconductor device 112 formed thereon. And a shallow trench isolation (STI) 102 is formed in the substrate 100 between the first semiconductor device 110 and the second semiconductor device 112 for providing electrical isolation. The first semiconductor device 110 includes a first conductivity type, the second semiconductor device 112 includes a second conductivity type, and the first conductivity type and the second conductivity type are complementary. In the preferred embodiment, the first conductivity type is a p-type and the second conductivity type is an n-type.

Please refer to FIG. 1. The first semiconductor device 110 and the second semiconductor device 112 respectively includes a gate dielectric layer 104, a bottom barrier layer 106 and a dummy gate such as a polysilicon layer (not shown). The gate dielectric layer 104 can be a conventional silicon oxide ($SiO_2$) layer, a high-K gate dielectric layer, or its combination. The bottom barrier layer 106 can include titanium nitride (TiN), but not limited to this. Furthermore, the first semiconductor device 110 and the second semiconductor device 112 respectively include first lightly doped drains (LDDs) 120 and second LDDs 122, a spacer 124, a first source/drain 130 and a second source/drain 132. Additionally, salicides 134 are formed on the first source/drain 130 and the second source/drain 132. After forming the first semiconductor device 110 and the second semiconductor device 112, a contact etch stop layer (CESL) 140 and an inter-layer dielectric (ILD) layer 142 are sequentially formed. Since the steps and material choices for the abovementioned elements are well-known to those skilled in the art, those details are omitted herein in the interest of brevity. Furthermore, selective strain scheme (SSS) can be used in the preferred embodiment. For example, a selective epitaxial growth (SEG) method can be used to form the first source/drain 130 and the second source/drain 132.

Please still refer to FIG. 1. After forming the CESL 140 and the ILD layer 142, a planarization process is performed to remove a portion of the CESL 140 and a portion of the ILD layer 142 to expose the dummy gates of the first semiconductor device 110 and the second semiconductor device 112. Then, a suitable etching process is performed to remove the dummy gates of the first semiconductor device 110 and the second semiconductor device 112, and thus a first gate trench 150 and a second gate trench 152 are simultaneously formed in the first semiconductor device 110 and the second semiconductor device 112, respectively. It is noteworthy that the preferred embodiment is integrated with the high-k first process; therefore the gate dielectric layer 104 includes high-k materials such as rare earth metal oxide. The high-k gate dielectric layer 104 can include material selected from the group consisting of as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). Additionally, an interfacial layer (not shown) can be formed in between the high-k gate dielectric layer 104 and the substrate 100. After forming the first gate trench 150 and the second gate trench 152, an etch stop layer 108 can be formed on the bottom barrier layer 106 in both of the first gate trench 150 and the second gate trench 152. The etch stop layer 108 can include tantalum nitride (TaN), but not limited to this.

It is also noteworthy that the manufacturing method provided by the present invention can be integrated with the high-k last process; therefore the gate dielectric layer includes a conventional $SiO_2$ layer. After removing the polysilicon layer to form the first gate trench 150 and the second gate trench 152, the gate dielectric layer exposed in the bottoms of the first gate trench 150 and the second gate trench 152 serves as an interfacial layer. Next, a high-k gate dielectric layer 104 including materials as mentioned above is formed on the substrate 100. Then, the etch stop layer 108 is formed on the high-k gate dielectric layer 104.

Please refer to FIG. 1 again. After forming the etch stop layer 108, a chemical vapor deposition (CVD) or a physical vapor deposition (PVD) is performed to form a first work function metal layer 160 in the first gate trench 150 and the second gate trench 152. The first work function metal layer 160 is a p-type work function metal layer and exemplarily includes TiN, TaN, titanium carbide (TiC), tantalum carbide (TaC), tungsten carbide (WC), or aluminum titanium nitride (TiAlN), but not limited to this. In addition, the first work function metal layer 160 can be a single-layered structure or a multi-layered structure.

Please still refer to FIG. 1. After forming the first work function metal layer 160, a DPO 162 is performed for tuning a work function of the first work function metal layer 160. The DPO 162 is performed at a process temperature, and the process temperature is lower than 400° C., preferably between a room temperature and 200° C. Furthermore, the DPO 162 includes introducing nitrogen (N) or argon (Ar). According to the preferred embodiment, the work function of the first work function metal layer 160 is adjusted to a target work function, and the target work function is between 4.9 eV and 5.2 eV, preferably is 5.1 eV.

It is noteworthy that when a post-metal thermal treatment is performed to the first work function metal layer 160 with a temperature higher than 400° C., even higher than 550° C., such high temperature is unfavorable to the low thermal budget of the first work function metal layer 160, and thus renders adverse impact to the first function metal layer 160. Therefore, the preferred embodiment provides the DPO 162 for tuning the work function of the first work function metal layer 160 to obtain a target work function, and thus the post-metal thermal treatment can be cancelled and replaced. Consequently, the adverse impact to the first work function metal layer 160 due to the high temperature of the post-metal thermal treatment is avoided.

Figure 2:
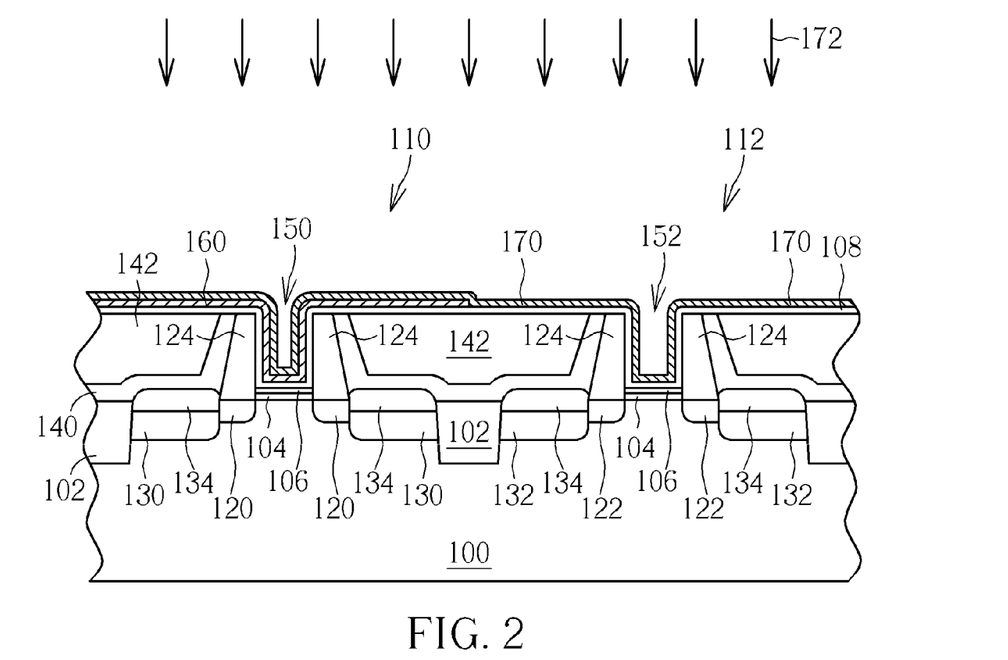
FIG. 2 is a schematic drawing in a step subsequent to FIG. 1.

Please refer to FIG. 2. Next, a patterned mask is formed on the substrate 100. The patterned mask can be a patterned photoresist layer (not shown), but not limited to this. The patterned mask covers the first semiconductor device 110 and exposes the first work function metal layer 160 in the second semiconductor device 112. Then, a suitable etchant is used to remove the first work function metal layer 160 not cover by the patterned mask to expose the etch stop layer 108 in the second gate trench 152. During removing the first work function metal layer 160, the etch stop layer 108 renders protection to the underneath bottom barrier layer 106 and high-k gate dielectric layer 104. It is noteworthy that for improving the gap-filling result of the following formed metal materials, the patterned mask can be formed only in the first gate trench 150 and a surface of the patterned mask is lower than the opening of the first gate trench 150. Accordingly, the first work function metal layer 160 not covered by the patterned mask is removed and the remained first work function metal layer 160 is left only in the first gate trench 150, particularly on the bottom and sidewalls of the first gate trench 150. That means a height of the remained first work function metal layer 160 is smaller than a depth of the first gate trench 150. Consequently, the gap-filling result of the following formed metal materials can be improved.

Please still refer to FIG. 2. After removing the first work function metal layer 160 from the second gate trench 152, a CVD process or a PVD process is performed to form a second work function metal layer 170 on the substrate 100. The second work function metal layer 170 includes an n-type work function metal layer such as titanium aluminide (TiAl), zirconium aluminide (ZrAl), tungsten aluminide (WAl), tantalum aluminide (TaAl), or hafnium aluminide (HfAl), but not limited to this. Additionally, the second work function metal layer 170 can be a single-layered structure or a multi-layered structure.

Please refer to FIG. 2 again. After forming the second work function metal layer 170, a decoupled plasma nitridation (DPN) 172 is performed for tuning a work function of the second work function metal layer 170. The DPN 172 is performed at a process temperature, and the process temperature is lower than 400° C., and preferably between a room temperature and 200° C. Furthermore, the DPN 172 includes introducing N or Ar. According to the preferred embodiment, the work function of the second work function metal layer 170 is adjusted to a target work function, and the target work function is between 3.9 eV and 4.2 eV, preferably is 4.1 eV. It is also noteworthy that a mask (not shown) can be selectively formed on the first semiconductor device 110 before performing the DPN 172. Thus the second work function metal layer 170 and the first work function metal layer 160 in the first semiconductor device 110 are protected from the DPN 172, and the work functions of the second work function metal layer 170 and the first work function metal layer 160 are not influenced.

Figure 3:
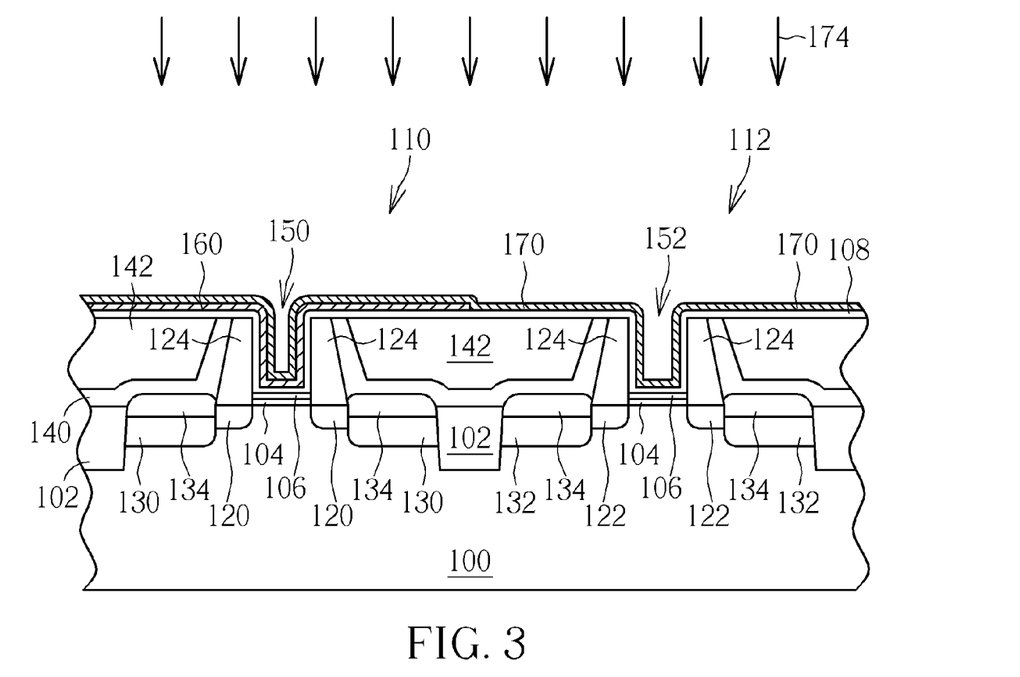
FIG. 3 is a schematic drawing in a step subsequent to FIG. 2.

Please refer to FIG. 3. After performing the DPN 172 for tuning the work function of the second work function metal layer 170, a thermal treatment 174 is performed for further stabilizing and facilitating the bonding between N atom and the metal in the second work function metal layer 170. It is noteworthy that the thermal treatment 174 provided by the preferred embodiment is performed at a process temperature lower than 400° C., which is more advantageous to the low thermal budget of the metal material. In other words, the lower-temperatured thermal treatment 174 provided by the preferred embodiment is to improve the stability of the second work function metal layer 170 without impacting on the first work function metal layer 160 and the second work function metal layer 170.

Figure 4:
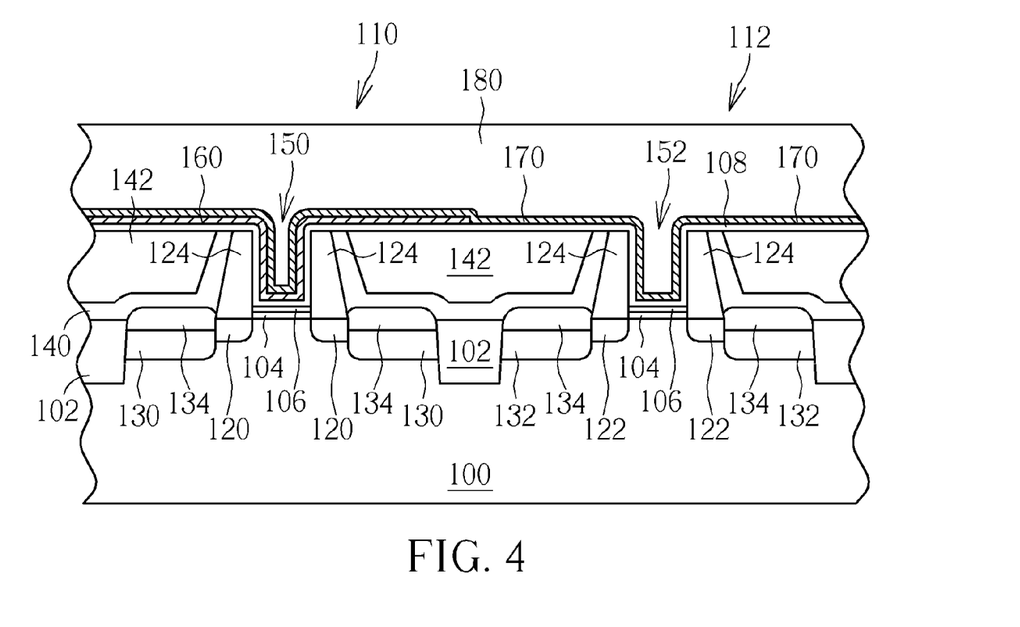
FIG. 4 is a schematic drawing in a step subsequent to FIG. 3.

Please refer to FIG. 4. Next, a filling metal layer 180 is formed on the second work function metal layer 170 in both of the first gate trench 150 and the second gate trench 152. Additionally, a top barrier layer (not shown) is preferably formed between the second work function metal layer 170 and the filling metal layer 180. The top barrier layer can include TiN, but not limited to this. The filling metal layer 180 is formed to fill up the first gate trench 150 and the second gate trench 152. The filling metal layer 180 includes materials with low resistance and superior gap-filling characteristic, such as Al, TiAl, or titanium aluminum oxide (TiAlO), but not limited to this.

Figure 5:
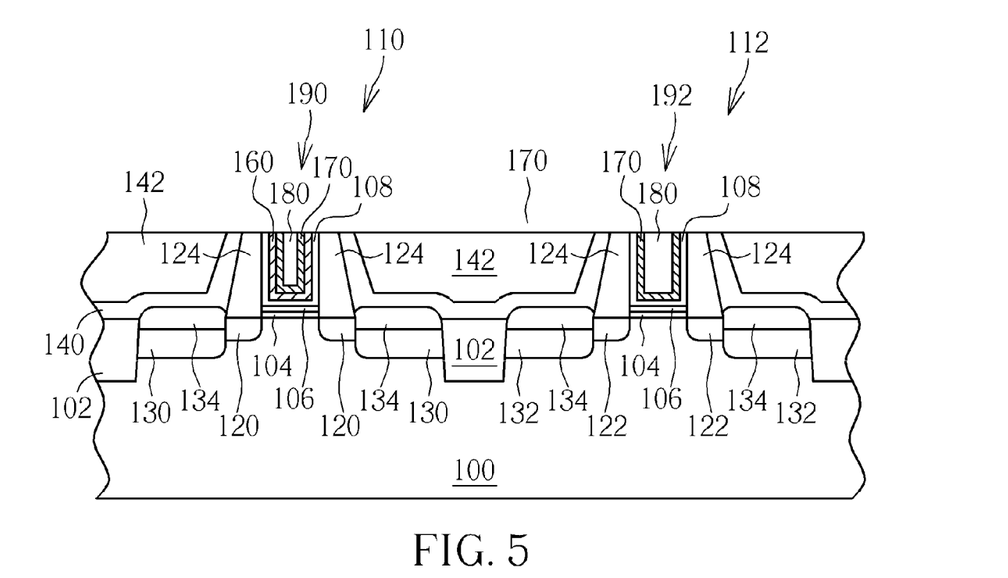

Please refer to FIG. 5. Subsequently, a planarization process, such as a chemical mechanical polishing (CMP) process is performed to remove unnecessary filling metal layer 180, second work function metal layer 170, first work function metal layer 160, and etch stop layer 108. Consequently, a first metal gate 190 and a second metal gate 192 are obtained. In addition, the ILD layer 142 and the CESL 140 can be selectively removed and sequentially reformed on the substrate 100 for improving performance of the semiconductor devices 110, 112 in the preferred embodiment.

According to the manufacturing method for a semiconductor device provided by the present invention, the DPO 162 and the DPN 172 are respectively performed to the first work function metal layer 160 and the second work function metal layer 170 for tuning the work functions of the first work function metal layer 160 and of the second work function metal layer 170. Since the first work function metal layer 160 treated by the DPO 162 and the second work function metal layer 170 treated by the DPN 172 have obtained the target work functions, the post-metal anneal treatment can be replaced or be performed at a much lower process temperature. In other words, the manufacturing method for a semiconductor device provided by the present invention not only ensures the p-type or n-type semiconductor device obtains a metal gate having the work function fulfilling its requirement but also prevents the adverse impact from the post-metal anneal treatment and thus ensures the performance of the p-type or n-type semiconductor device.

Figure 6:
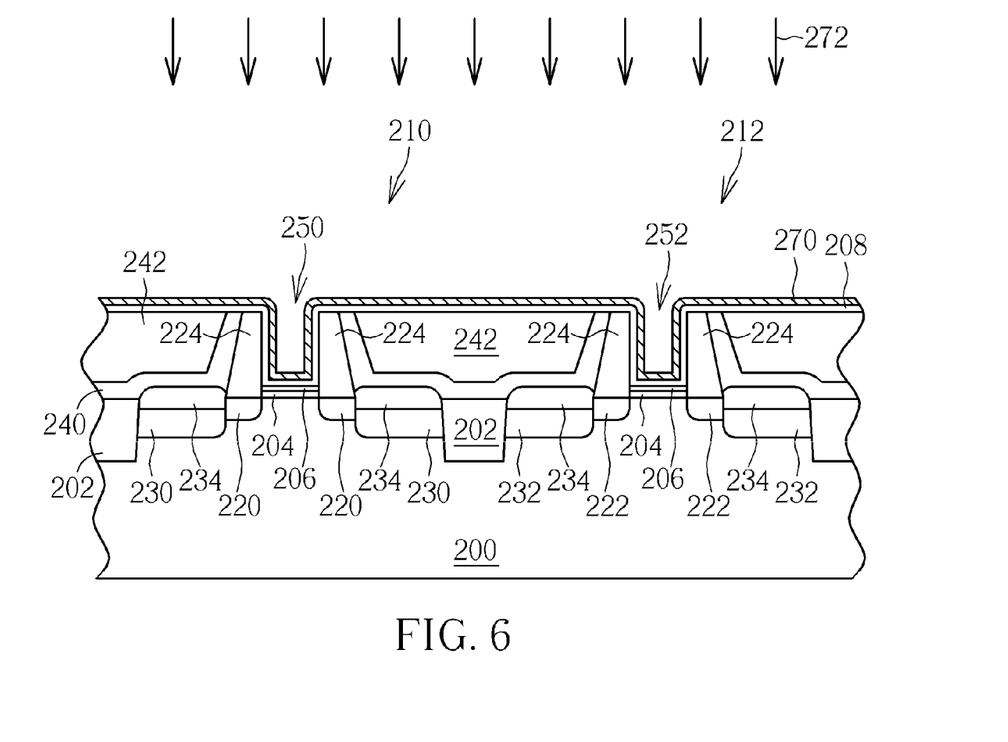

Please refer to FIGS. 6-10, which are drawings illustrating a manufacturing method for a semiconductor device having metal gate provided by a second preferred embodiment of the present invention. It should be noted that the elements the same in both first and second preferred embodiments are designated by the same numerals, the material choices for the same elements are omitted for simplicity. As shown in FIG. 6, the preferred embodiment first provides a substrate 200, and the substrate 200 includes a first semiconductor device 210 and a second semiconductor device 212 formed thereon. A STI 202 is formed in the substrate 200 between the first semiconductor device 210 and the second semiconductor device 212 for providing electrical isolation. The first semiconductor device 210 includes a first conductivity type, the second semiconductor device 212 includes a second conductivity type, and the first conductivity type and the second conductivity type are complementary. In the preferred embodiment, the first conductivity type is a p-type and the second conductivity type is an n-type.

Please refer to FIG. 6. The first semiconductor device 210 and the second semiconductor device 212 respectively include a gate dielectric layer 204, a bottom barrier layer 206, and a dummy gate (not shown). Furthermore, the first semiconductor device 210 and the second semiconductor device 212 respectively include first LDDs 220 and second LDDs 222, a spacer 224, a first source/drain 230 and a second source/drain 232. Additionally, salicides 234 are formed on the first source/drain 230 and the second source/drain 232. After forming the first semiconductor device 210 and the second semiconductor device 212, a CESL 240 and an ILD layer 242 are sequentially formed. Since the steps and material choices for the abovementioned elements are well-known to those skilled in the art, those details are omitted herein in the interest of brevity. Furthermore, SSS such as SEG method also can be used to form the first source/drain 230 and the second source/drain 232 in the preferred embodiment.

Please still refer to FIG. 6. Then, a planarization process is performed and followed by a suitable etching process performed to remove the dummy gates of the first semiconductor device 210 and the second semiconductor device 212, and thus a first gate trench 250 and a second gate trench 252 are simultaneously formed in the first semiconductor device 210 and the second semiconductor device 212, respectively. It is noteworthy that the preferred embodiment can be integrated with the high-k first process; therefore the gate dielectric layer 204 includes high-k materials, and an interfacial layer (not shown) can be formed in between the high-k gate dielectric layer 204 and the substrate 200. The manufacturing method provided by the present invention also can be integrated with the high-k last process; therefore the gate dielectric layer includes a conventional $SiO_2$ layer and serves as an interfacial layer. Next, a high-k gate dielectric layer 204 is formed on the substrate 200. After forming the first gate trench 250 and the second gate trench 252, or after forming the high-k gate dielectric layer 204, an etch stop layer 208 is formed on the high-k gate dielectric layer 204.

Please refer to FIG. 6 again. After forming the etch stop layer 208, a second work function metal layer 270 is formed in the first gate trench 250 and the second gate trench 252. The second work function metal layer 270 is an n-type work function metal layer. In addition, the second work function metal layer 270 can be a single-layered structure or a multi-layered structure.

As shown in FIG. 6, after forming the second work function metal layer 270, a DPN 272 is performed for tuning a work function of the second work function metal layer 270. Parameters such as process temperature and steps of the DPN 272 are identical to those described in the first preferred embodiment, therefore the details are omitted for simplicity. According to the preferred embodiment, the work function of the second work function metal layer 270 is adjusted to a target work function, and the target work function is between 3.9 eV and 4.2 eV, preferably is 4.1 eV.

Figure 7:
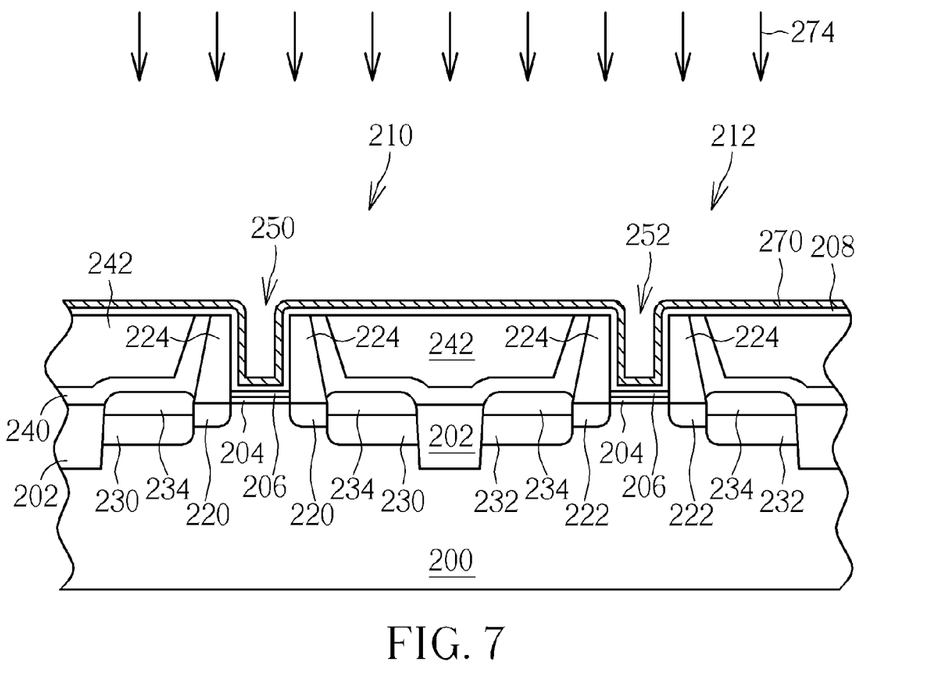
FIG. 7 is a schematic drawing in a step subsequent to FIG. 6.

Please refer to FIG. 7. After performing the DPN 272 for tuning the work function of the second work function metal layer 270, a thermal treatment 274 is performed for further stabilizing and facilitating the bonding between N atom and the metal in the second work function metal layer 270. It is noteworthy that the thermal treatment 274 provided by the preferred embodiment is performed at a process temperature lower than 400° C., which is more advantageous to the low thermal budget of the metal material.

Figure 8:
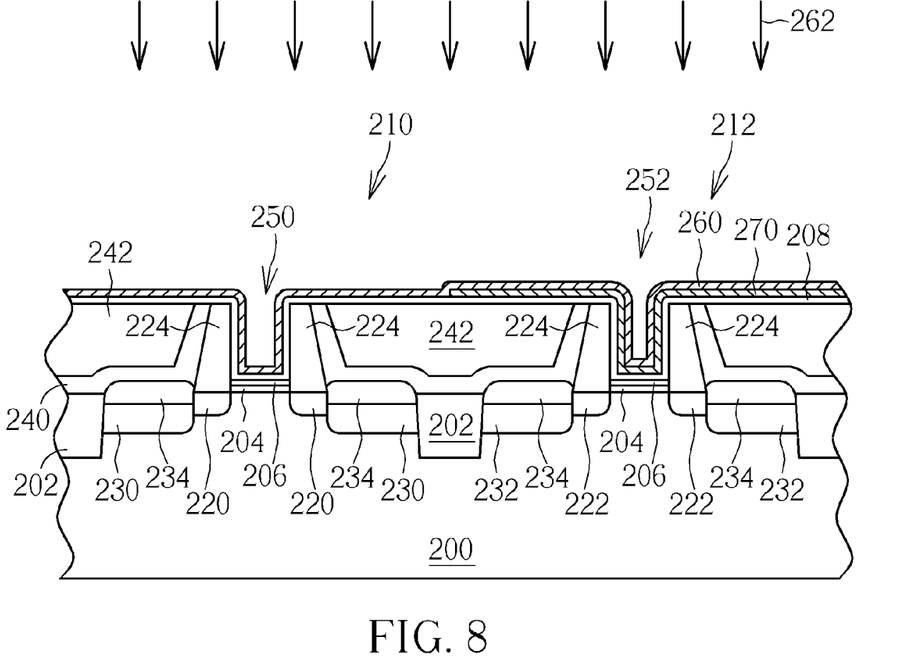
FIG. 8 is a schematic drawing in a step subsequent to FIG. 7.

Please refer to FIG. 8. Next, a patterned mask is formed on the substrate 200. The patterned mask can be a patterned photoresist layer (not shown), but not limited to this. The patterned mask covers the second semiconductor device 212 and exposes the second work function metal layer 270 in the first semiconductor device 210. Then, a suitable etchant is used to remove the second work function metal layer 270 not cover by the patterned mask. It is noteworthy that for improving the gap-filling result of the following formed metal materials, the patterned mask can be formed only in the second gate trench 252 and a surface of the patterned mask is lower than the opening of the second gate trench 252. Accordingly, the second work function metal layer 270 not covered by the patterned mask is removed and the remained second work function metal layer 270 is left only in the second gate trench 252, particularly on the bottom and sidewalls of the second gate trench 252. That means a height of the remained second work function metal layer 270 is smaller than a depth of the second gate trench 252. Consequently, the gap-filling result of the following formed metal materials can be improved.

Please still refer to FIG. 8. After removing the second work function metal layer 270 from the first gate trench 250, a first work function metal layer 260 is formed on the substrate 200. The first work function metal layer 260 includes a p-type work function metal layer. Additionally, the first work function metal layer 260 can be a single-layered structure or a multi-layered structure.

As shown in FIG. 8, after forming the first work function metal layer 260, a DPO 262 is performed for tuning a work function of the first work function metal layer 260. Parameters such as process temperature and steps of the DPO 262 are identical to those described in the first preferred embodiment, therefore the details are omitted for simplicity. According to the preferred embodiment, the work function of the first work function metal layer 260 is adjusted to a target work function, and the target work function is between 4.9 eV and 5.2 eV, preferably is 5.1 eV. It is also noteworthy that a mask (not shown) can be selectively formed on the second semiconductor device 212 before performing the DPO 262. Thus the second work function metal layer 270 and the first work function metal layer 260 in the second semiconductor device 212 are protected from the DPO 262, and the work functions of the second work function metal layer 270 and the first work function metal layer 260 are not influenced.

It is noteworthy that when a post-metal thermal treatment is performed to the first work function metal layer 260 with a temperature higher than 400° C., even higher than 550° C., such high temperature is unfavorable to the low thermal budget of the first work function metal layer 260, and thus renders adverse impact to the first work function metal layer 260. Therefore, the preferred embodiment provides the DPO 262 for tuning the work function of the first work function metal layer 260 to obtain a target work function, and thus the post-metal thermal treatment can be cancelled and replaced. Consequently, the adverse impact to the first work function metal layer 260 due to the high temperature of the post-metal thermal treatment is avoided.

Figure 9:
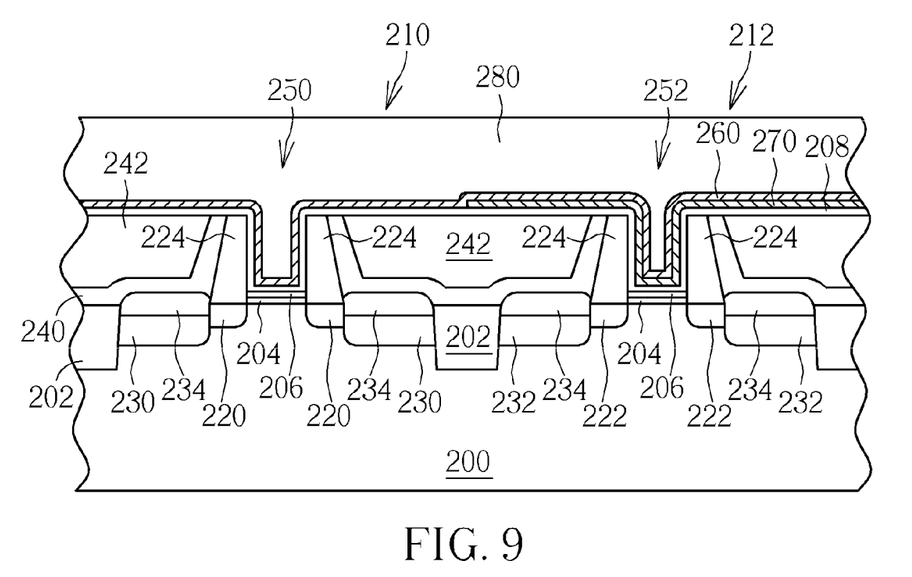
FIG. 9 is a schematic drawing in a step subsequent to FIG. 8.

Please refer to FIG. 9. Next, a filling metal layer 280 is formed on the first work function metal layer 260 in both of the first gate trench 250 and the second gate trench 252. Additionally, a top barrier layer (not shown) is preferably formed between the first work function metal layer 260 and the filling metal layer 280. The filling metal layer 280 is formed to fill up the first gate trench 250 and the second gate trench 252 therefore the filling metal layer 280 includes materials with low resistance and superior gap-filling characteristic.

Figure 10:
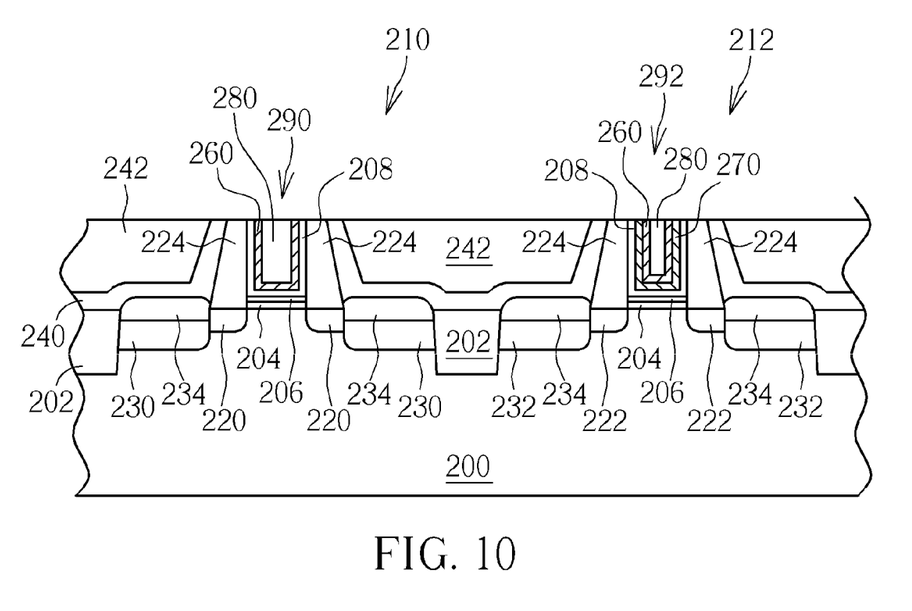
FIG. 10 is a schematic drawing in a step subsequent to FIG. 9.

Please refer to FIG. 10. Subsequently, a planarization process, such as a CMP process is performed to remove unnecessary filling metal layer 280, first work function metal layer 260, second work function metal layer 270, and etch stop layer 208. Consequently, a first metal gate 290 and a second metal gate 292 are obtained. In addition, the ILD layer 242 and the CESL 240 can be selectively removed and sequentially reformed on the substrate 200 for improving performance of the semiconductor devices 210/212 in the preferred embodiment.

According to the manufacturing method for a semiconductor device provided by the present invention, the DPN 272 and the DPO 262 are respectively performed to the second work function metal layer 270 and the first work function metal layer 260 for tuning the work functions of the second work function metal layer 270 and of the first work function metal layer 260. Since the second work function metal layer 270 treated by the DPN 272 and the first work function metal layer 260 treated by the DPO 262 have obtained the target work functions, the post-metal anneal treatment can be replaced or be performed at a much lower process temperature. In other words, the manufacturing method for a semiconductor device provided by the present invention not only ensures the p-type or n-type semiconductor device obtains a metal gate having the work function fulfilling its requirement but also prevents the adverse impact from the post-metal thermal treatment and thus ensures the performance of the p-type or n-type semiconductor device.

According to the manufacturing method for a semiconductor device provided by the present invention, the DPO is performed to the first work function metal layer and the DPN is performed to the second work function metal layer for tuning the work functions. Since the first work function metal layer treated by the DPO and the second work function metal layer treated by the DPN have obtained the target work functions, the post-metal anneal treatment is replaced, and thus the adverse impact from the post-metal anneal treatment is avoided. In other words, the manufacturing method for a semiconductor device provided by the present invention not only ensures the p-type or n-type semiconductor device obtains a metal gate having the work function fulfilling its requirement but also ensures the performance of the p-type or n-type semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for a semiconductor device having a metal gate comprising:
providing a substrate having at least a first semiconductor device and a second semiconductor device formed thereon, the first semiconductor device being a p-type semiconductor device and the second semiconductor device being an n-type semiconductor device;

forming a first gate trench in the first semiconductor device and a second gate trench in the second semiconductor device;

forming a first work function metal layer in the first gate trench and the second trench after forming the first gate trench and the second trench;

performing a decoupled plasma oxidation (DPO) to the first work function metal layer;

removing the first work function metal layer from the second trench after the DPO;

forming a second work function metal layer in the second gate trench after the DPO; and performing a decoupled plasma nitridation (DPN) to the second work function metal layer.

2. The manufacturing method for the semiconductor device having the metal gate according to claim 1, wherein the DPO is performed at a process temperature, and the process temperature is lower than 400° C.

3. The manufacturing method for the semiconductor device having the metal gate according to claim 2, wherein the process temperature is between a room temperature and 200° C.

4. The manufacturing method for the semiconductor device having the metal gate according to claim 1, wherein the DPO comprises introducing nitrogen (N) or argon (Ar).

5. The manufacturing method for the semiconductor device having the metal gate according to claim 1, wherein the DPN is performed at a process temperature, and the process temperature is lower than 400° C.

6. The manufacturing method for the semiconductor device having the metal gate according to claim 5, wherein the process temperature is between a room temperature and 200° C.

7. The manufacturing method for the semiconductor device having the metal gate according to claim 1, wherein the DPN comprises introducing N or Ar.

8. The manufacturing method for the semiconductor device having the metal gate according to claim 1, further comprising performing a thermal treatment after the DPN.

9. The manufacturing method for the semiconductor device having the metal gate according to claim 8, wherein the thermal treatment is performed at a process temperature lower than 400° C.

10. The manufacturing method for the semiconductor device having the metal gate according to claim 1, wherein the first gate trench and the second gate trench are simultaneously formed.

11. The manufacturing method for the semiconductor device having the metal gate according to claim 1, further comprising forming a filling metal, and the filling metal fills up the first gate trench.

12. A manufacturing method for a semiconductor device having a metal gate comprising:

providing a substrate having at least a first semiconductor device and a second semiconductor device formed thereon, the first semiconductor device being a p-type semiconductor device and the second semiconductor device being an n-type semiconductor device;

forming a first gate trench in the first semiconductor device and a second gate trench in the second semiconductor device;

forming a second work function metal layer in the first gate trench and the second gate trench after forming the first gate trench and the second gate trench;

performing a decoupled plasma nitridation (DPN) to the second work function metal layer;

removing the second work function metal layer from the first gate trench after the DPN;

forming a first work function metal layer in the first gate trench after the DPN; and performing a decoupled plasma oxidation (DPO) to the first work function metal layer.

13. The manufacturing method for the semiconductor device having the metal gate, according to claim 12, wherein the DPO is performed at a process temperature, and the process temperature is lower than 400° C.

14. The manufacturing method for the semiconductor device having the metal gate, according to claim 12, further comprising performing a thermal treatment after the DPO.

15. The manufacturing method for the semiconductor device having the metal gate, according to claim 12, further comprising performing a thermal treatment after the DPN.

* * * * *